(12) United States Patent
Vaananen et al.

(10) Patent No.: US 10,321,601 B2
(45) Date of Patent: Jun. 11, 2019

(54) SYSTEM AND METHOD FOR RESTRICTING AIRFLOW THROUGH A PORTION OF AN ELECTRONICS ENCLOSURE

(75) Inventors: Pasi Jukka Vaananen, Waltham, MA (US); Stephen A. Hauser, Carlisle, MA (US)

(73) Assignee: Artesyn Embedded Computing, Inc., Tempe, AZ (US)

( * ) Notice: Subject to any disclaimer, the term of this patent is extended or adjusted under 35 U.S.C. 154(b) by 1195 days.

(21) Appl. No.: 12/580,477

(22) Filed: Oct. 16, 2009

(65) Prior Publication Data
US 2010/0216389 A1 Aug. 26, 2010

Related U.S. Application Data

(60) Provisional application No. 61/196,437, filed on Oct. 17, 2008.

(51) Int. Cl.
*H05K 7/20* (2006.01)

(52) U.S. Cl.
CPC ..... *H05K 7/20145* (2013.01); *H05K 7/20727* (2013.01)

(58) Field of Classification Search
CPC ... H05K 7/20; H05K 7/20145; H05K 7/20727
USPC ....................................................... 454/184
See application file for complete search history.

(56) References Cited

U.S. PATENT DOCUMENTS

| 6,118,667 | A  | * | 9/2000  | Grosser et al. | 361/752 |
| 6,193,339 | B1 | * | 2/2001  | Behl et al.    | 312/223.2 |
| 6,285,548 | B1 | * | 9/2001  | Hamlet         | H05K 9/0062 174/15.1 |
| 6,544,311 | B1 | * | 4/2003  | Walton et al.  | 55/385.6 |
| 6,650,535 | B1 | * | 11/2003 | Moss et al.    | 361/679.33 |
| 6,879,486 | B1 | * | 4/2005  | Banton et al.  | 361/690 |
| 6,922,337 | B2 | * | 7/2005  | Malone et al.  | 361/695 |
| 6,924,977 | B2 | * | 8/2005  | Bestwick et al.| 361/679.51 |
| 6,963,489 | B2 | * | 11/2005 | Askeland et al.| 361/679.51 |

(Continued)

FOREIGN PATENT DOCUMENTS

JP    6260789 A    9/1994

OTHER PUBLICATIONS

Chinese Office Action for Chinese Patent Application No. 200910206111.7 dated Sep. 23, 2011.

(Continued)

*Primary Examiner* — Steven B McAllister
*Assistant Examiner* — Samantha Probst
(74) *Attorney, Agent, or Firm* — Harness, Dickey & Pierce, P.L.C.

(57) ABSTRACT

An apparatus is disclosed for restricting air flow through an electronics enclosure. The apparatus may include a panel having at least one edge adapted to be secured to a surface of the electronics enclosure to thus place the panel in a path of a cooling air flow flowing through a cardcage portion of the enclosure. The panel may have a footprint that at least substantially fills an opening through which said cooling air flow flows through said cardcage portion of the enclosure. The panel may have a plurality of openings so that the panel reduces a volume of a cooling air flow flowing through the panel by a predetermined desired degree, and thus reduces a volume of the air flow through the cardcage to a desired volume.

10 Claims, 2 Drawing Sheets

(56) References Cited

U.S. PATENT DOCUMENTS

| | | | |
|---|---|---|---|
| 7,050,301 B2* | 5/2006 | Wong et al. | 361/695 |
| 7,079,387 B2* | 7/2006 | Brooks et al. | 361/679.51 |
| 7,183,500 B2* | 2/2007 | Campini et al. | 174/392 |
| 7,215,552 B2 | 5/2007 | Shipley et al. | |
| 7,259,961 B2* | 8/2007 | Lucero et al. | 361/695 |
| 7,382,614 B2* | 6/2008 | Lee | 361/695 |
| 7,394,654 B2* | 7/2008 | Zieman et al. | 361/695 |
| 7,522,414 B2* | 4/2009 | Karstens | H05K 5/0017 |
| | | | 361/690 |
| 7,652,891 B2 | 1/2010 | Lucero et al. | |
| 7,965,504 B2* | 6/2011 | Hamlin | 361/695 |
| 8,064,200 B1* | 11/2011 | West et al. | 361/695 |
| 2003/0151894 A1* | 8/2003 | Singer | 361/695 |
| 2004/0057210 A1* | 3/2004 | Wilson et al. | 361/695 |
| 2004/0177757 A1* | 9/2004 | Bailey | B01D 46/0056 |
| | | | 95/273 |
| 2004/0252456 A1* | 12/2004 | Larson | G06F 1/20 |
| | | | 361/694 |
| 2005/0286222 A1* | 12/2005 | Lucero et al. | 361/690 |
| 2006/0199498 A1* | 9/2006 | Shipley et al. | 454/184 |
| 2007/0178822 A1* | 8/2007 | Lanus et al. | 454/184 |
| 2007/0183129 A1* | 8/2007 | Lewis, II | H05K 9/0041 |
| | | | 361/724 |
| 2007/0207720 A1* | 9/2007 | Henry et al. | 454/184 |
| 2007/0274039 A1* | 11/2007 | Hamlin | 361/695 |

OTHER PUBLICATIONS

Intel Corporation, Intel Netstructure MPCHC0001 14U Shelf, Preliminary Technical Product Specification, pp. 75-86, Dec. 2003.
Chinese Office Action for Chinese Patent Application No. 200910206111.7, dated Dec. 24, 2012, and English translation thereof.

* cited by examiner

SYSTEM AND METHOD FOR RESTRICTING AIRFLOW THROUGH A PORTION OF AN ELECTRONICS ENCLOSURE

CROSS REFERENCE TO RELATED APPLICATIONS

The present application claims priority from U.S. Provisional patent application Ser. No. 61/196,437, filed Oct. 17, 2008, the entire contents of which are incorporated herein by reference.

FIELD

The present disclosure relates to electronics equipment enclosures, and more particularly to a system and method for restricting a volume of air flow through a portion of an electronics enclosure to achieve more efficient cooling of electronics modules contained in various areas of the enclosure.

BACKGROUND

The statements in this section merely provide background information related to the present disclosure and may not constitute prior art.

In a present day, standardized, AdvancedTCA telecommunications chassis a backplane is employed that separates a front card cage portion of the enclosure where front boards are located from a rear card cage area where Rear Transition Modules (RTMs) are located. Typically the front boards have components that produce significantly greater power dissipation than the RTMs, and thus require a significantly greater volume of air flow to sufficiently cool than the RTMs require for adequate cooling. Present day open specifications for an AdvancedTCA chassis state that the power dissipation of an RTM is to be about 0.125 of that of a front board. However, present day cooling subsystems used with an AdvancedTCA chassis are set up in terms of the total area of the RTMs versus that of the front boards. The area of an RTM is about 25% that of a front board. So a typical present day cooling system will be set up such that the RTM card cage area of a chassis (i.e., enclosure) will receive about 25% of the total volume of air flow being delivered to the chassis. This is so even though the power dissipation target for each RTM is stated to be only 0.125% of the front board power dissipation.

The actual needed cooling air flow through an RTM card slot is directly proportional to the power being dissipated by an RTM, and thus is independent of the actual printed circuit board (PCB) area of the RTM. However, as described above, with a typical chassis cooling subsystem design, the RTMs will each be receiving an air flow that is proportional to its PCB area. This leads to substantially higher air flow to the RTMs than what is actually needed to adequately cool the RTMs, which in turn leads to inefficient use of the cooling air flow being directed through a chassis. In fact, the air flow over each RTM in an AdvancedTCA chassis may actually be about double that which is needed to effect adequate cooling of the RTM. This unnecessarily high air flow over the RTMs also increases the overall system energy consumption and contributes to increased acoustic noise emissions from the air flow flowing through the RTM card cage.

SUMMARY

An apparatus is disclosed for restricting air flow through an electronics enclosure. In one aspect the apparatus may include a panel having at least one edge adapted to be secured to a surface of the electronics enclosure to thus place the panel in a path of a cooling air flow flowing through a cardcage portion of the enclosure. The panel may have a footprint that at least substantially fills an opening through which said cooling air flow flows through said cardcage portion of the enclosure. The panel may have a plurality of openings so that the panel reduces a volume of a cooling air flow flowing through the panel by a predetermined desired degree, and thus reduces a volume of the air flow through the cardcage to a desired volume.

In another aspect the present disclosure is directed to an apparatus for restricting air flow through an electronics enclosure having a rear transition module (RTM) disposed therein. The apparatus may include a panel having at least one edge adapted to be secured to a surface of the electronics enclosure to place the panel in a path of a cooling air flow flowing through a cardcage portion of the enclosure toward the RTM. The panel may have a footprint that completely fills an opening through which the cooling air flow flows through the cardcage portion of the enclosure. The panel may have a plurality of openings selectively arranged therein so that the panel reduces a volume of a cooling air flow that is able to flow through the panel by a predetermined desired degree, and thus limits a portion of the cooling air flow flowing to the RTM to a predetermined subquantity of the cooling air flow.

In another aspect the present disclosure relates to a method for restricting air flow through a portion of an electronics enclosure. The method may involve forming a panel having at least one edge adapted to be secured to a surface of the electronics enclosure to place the panel in a path of a cooling air flow flowing through a cardcage portion of the enclosure. The panel may further be formed to have a footprint that at least substantially fills an opening through which the cooling air flow flows through the cardcage portion of the enclosure. A plurality of openings may be formed in the panel so that the panel restricts a volume of cooling air flow flowing through the panel by a predetermined degree, and thus allows only a predetermined subportion of the volume of the cooling air flow to flow through the panel into the cardcage portion of the enclosure. The panel may be placed in the enclosure in the path of the cooling air flow so as to at least partially block the cooling air flow flowing through the cardcage portion of the electronics enclosure.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

Figure 1:
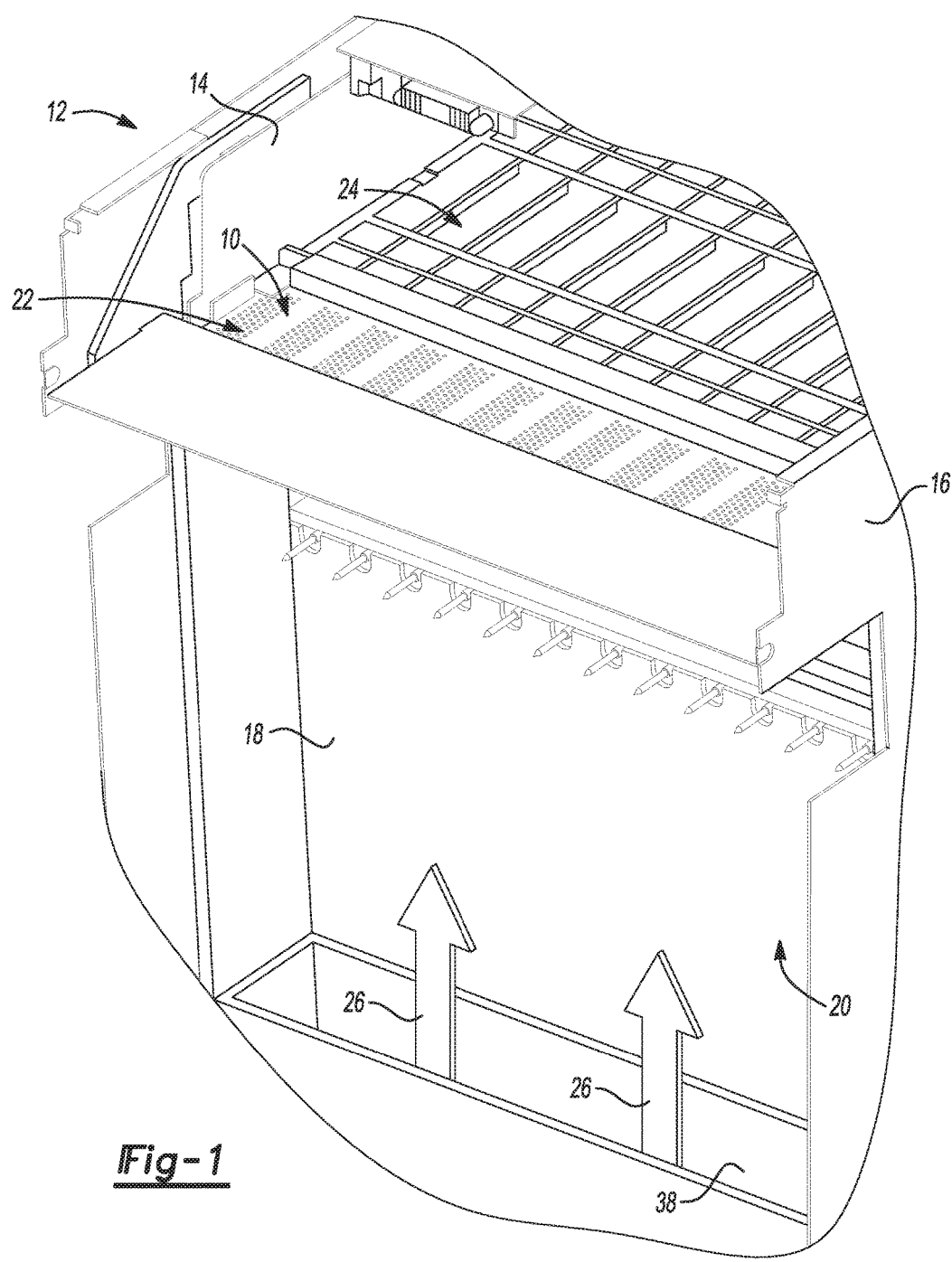
FIG. 1 is a perspective view of an enclosure illustrating an air flow restrictor panel secured over a top portion of a rear card cage area of the enclosure.

The following description is merely exemplary in nature and is not intended to limit the present disclosure, application, or uses. It should be understood that throughout the drawings, corresponding reference numerals indicate like or corresponding parts and features.

Referring to FIG. 1, there is shown an electronic equipment enclosure 12 in which an air flow restrictor panel 10 is secured. In this example the enclosure 12 forms an AdvancedTCA chassis (i.e., "shelf"), although it will be appreciated that the panel 10 may be used with virtually any form of equipment enclosure where it is desired to reduce an air flow through the enclosure.

The enclosure 12 includes sidewalls 14 and 16 between which extends a backplane 18. The sidewalls 14 and 16 and the backplane 18 form a rear card cage area 20 into which a plurality of Rear Transition Modules (RTMs) (not shown) may be installed. The rear card cage area 20 is sometimes referred to as the "RTM portion" or "RTM area" of the enclosure 12. The backplane 18 typically includes a plurality of electrical connectors (not shown) that allow the RTMs to be electrically interfaced to the backplane 18. In this example the restrictor panel 10 is coupled at a top 22 of the rear card cage area 20. On an opposite side of the backplane 18 is a front board card cage area 24 where a plurality of front boards (not shown) would be positioned and coupled to electrical connectors on the opposite side of the backplane.

In a typical chassis cooling system design, the RTM boards would receive a volume of air flow that is proportional to the respective areas of the front board and the RTM board, for example about 25% of the air flow directed through the front card cage area 24. However, the RTM boards typically have surface mounted components that dissipate only about 0.125% of the power that the front boards are required to dissipate. Thus, many cooling systems will be supplying a greater volume of cooling air flow through the rear card cage area 20 than what is actually needed to cool the RTM boards.

The restrictor panel 10 improves cooling efficiency by restricting a portion of the cooling air flow that is directed through the rear card cage area 20. Arrows 26 denote the direction of air flow through the rear card cage area 20. Thus, more of the total volume of air flow being output from the cooling system can be directed through the front board area 24 to improve cooling of the front boards. Also, by restricting the air flow flowing through the rear card cage area 20, and thus forcing more of the air flow to flow through the front board area 24, possibly a less powerful and less costly cooling system might suffice to provide the needed cooling to the enclosure 12.

Figure 2:
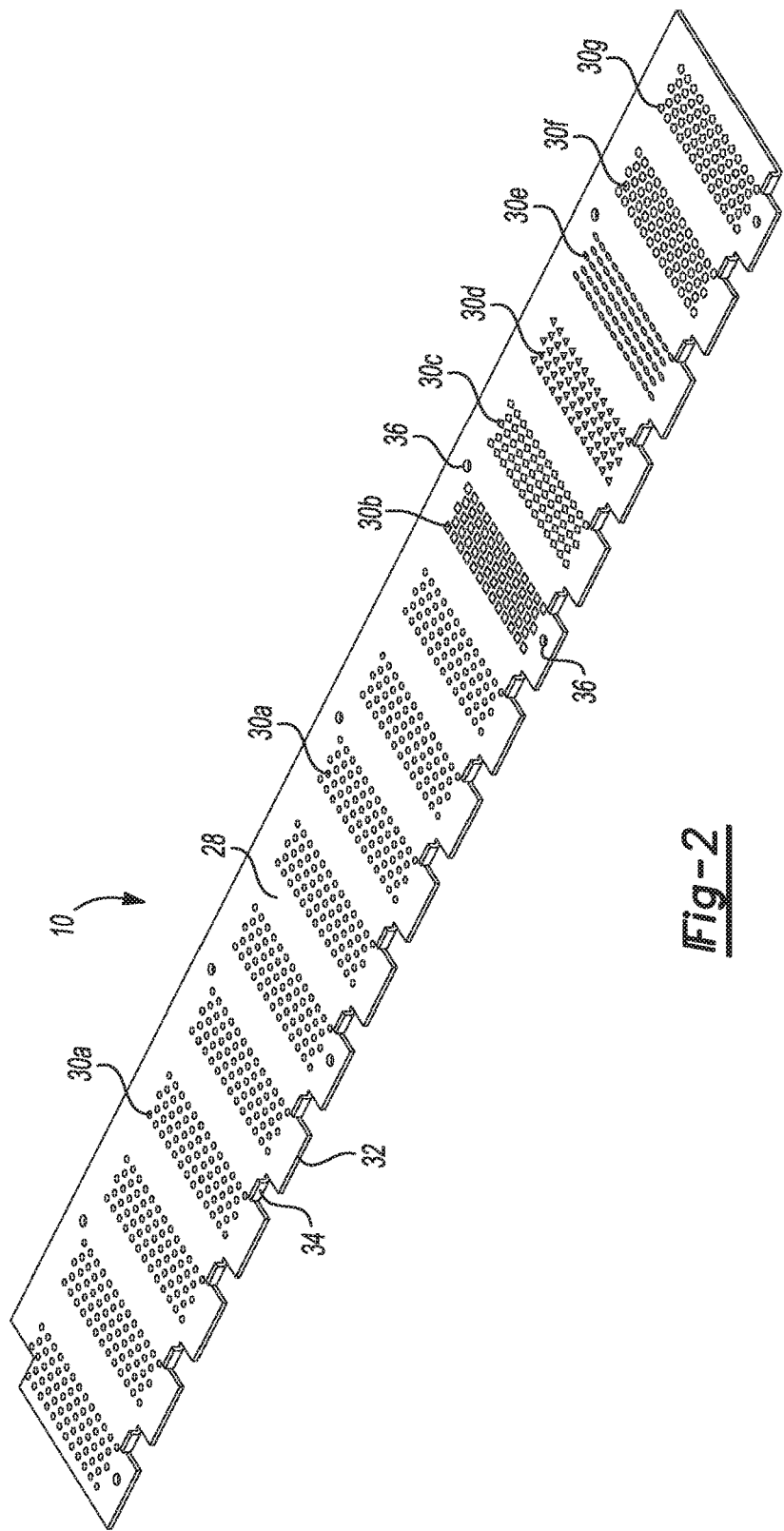
FIG. 2 is a perspective view of the air flow restrictor panel of FIG. 1.

Referring to FIG. 2 a perspective view of the restrictor panel 10 is shown. The restrictor panel 10 may include a central panel portion 28 having a plurality of perforations or holes 30 to allow air flow therethrough. One longitudinal edge 32 includes a plurality of bent tabs 34 that may be used to engage aligned openings in a frame portion of the enclosure 12 to aid in positioning and alignment of the restrictor panel 10 during installation. Holes 36 may be used to receive fasteners, for example (and without limitation) rivets or threaded fasteners, to securely affix the restrictor panel 10 to internal structural components or portions of the enclosure 12. The overall footprint of the restrictor panel 10 is preferably sufficiently large to fill the entire air flow opening at the top 22, as shown in FIG. 1. Thus, no portion of the air flow that flows through the RTM card cage area 20 is able to flow around the restrictor panel 10, but rather must flow through the restrictor panel.

The air flow holes 30 in the central panel portion 28 are of dimensions and of a quantity and configuration so as to controllably restrict the air flow through the rear card cage area 20 by a desired, predetermined degree. The holes 30 may form uniform or non-uniform patterns and may be comprised of circular holes 30a, square shaped holes 30b, diamond shaped holes 30c, triangular holes 30d, elliptical shaped holes 30e, hexagonal shaped holes 30f, pentagonal shaped holes 30g, or virtually any other shape of hole, or pattern of holes, that will provide the needed degree of air flow reduction (i.e., impedance) through the restrictor panel 10. The holes 30 may be clustered in groups, as shown in FIG. 1. The holes 30 could also comprise linear or non-linear slots arranged uniformly or non-uniformly over the central panel portion 28. In this regard it will be appreciated that the holes 30 may also be arranged with both uniform (or symmetrical) groups and non-uniform (non-symmetrical) groups on the central panel portion 28 to more precisely tailor how air flow is impeded by different areas of the restrictor panel 10. Non-symmetrical configurations of both holes or slots could also be used to balance air flow through the restrictor panel 10. Regardless of the specific configuration of the holes 30 or slots employed, the air flow impedance of the restrictor panel 10 will be selected based on the power dissipation requirements of the front boards and the RTM boards, as well as the cooling system capabilities, so that a precise, desired reduction in air flow through the rear card cage area 20 is achieved.

In FIG. 1 the restrictor panel 10 is shown coupled at the top 22 of the rear card cage area 20, but the restrictor panel could just as readily be coupled at a lower portion 38 of the rear card cage area adjacent to where cooling fans may be located. It is also possible that two restrictor panels 10 having different configurations of holes 30 could be incorporated, one at the top 22 and one at the lower portion 38 of the rear card cage area 20 to more finely tailor the air flow through the rear card cage area 20.

It may also be preferred to have the restrictor panel 10 constructed as an integral structural portion of the enclosure 12, or otherwise secured in a manner that adds significant additional structural rigidity to the enclosure 12. The restrictor panel 10 can also be located substantially anywhere along the air flow path through the RTM card cage area 20 as long as it is confined within the geometry defining the air flow path through the rear card cage area 20. Examples of other such locations could be on, or as an extension of, the backplane 18, or between the midplane and an enclosure wall portion if the air flow path to the rear card cage area 20 is provided through a gap adjacent the midplane. With respect to locating the restrictor panel 10 on the top 22 or bottom portion 38, the specific location selected may also depend on secondary considerations related to air mover placement and cooling subsystem redundancy. Other considerations may involve the location and flow leakage potential of the specific electronics modules, such as power entry modules (PEMs), that are typically installed below the RTM card cage area 20.

The selected placement configuration of the restrictor panel 10 should also ensure that there is sufficient air flow through the RTM rear card cage area 20 during various failure conditions. In a push-pull type air mover configuration, where one group of fans pushes air flow into the rear card cage area 20 at the bottom portion 38 while a second group of fans exhausts air out of the rear card cage area 20 at the top 22, it may be preferable to place the restrictor panel 10 at the top 22. Also, to ensure that the bottom area 38 of the rear card cage area 20 in a push-pull type air mover configuration remains pressurized during normal operation, and to avoid the possibility of unfiltered and/or hot air leaking into the enclosure 12, the top 22 placement may be most desirable. For pull-only or push-only configurations, and after consideration of various secondary constraints, the optimal placement may be at a location other than at the top 22, for example at the bottom area 38, as long as the added impedance (i.e., the restrictor panel 10) remains in the air flow path through the rear card cage area 20.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. An apparatus for restricting air flow through an electronics enclosure having a rear transition module (RTM) disposed therein, the apparatus comprising:
   the electronics enclosure;
   a removable panel having at least one edge adapted to be secured to a surface of the electronics enclosure to place the panel in a path of a cooling air flow flowing through a rear card cage area within the enclosure containing the RTM, the panel being located external to the rear card cage area within the enclosure and the panel being oriented orthogonally to cards supported by the card cage;
   the panel having a footprint that completely fills an opening through which said cooling air flow flows through said rear card cage area of the enclosure such that no portion of the cooling air flow in the rear card cage area flows around the panel; and
   the panel being formed as a plate having a plurality of openings selectively arranged therein having all of the cooling air flow flowing through the openings, wherein the openings form a pattern of perforations grouped into spaced apart clusters, the panel reducing a volume of the cooling air flow that is able to flow through the panel by a predetermined desired degree, and thus limits a portion of said cooling air flow flowing to said RTM to a predetermined subquantity of said cooling air flow, and thereby restricting the subquantity of the cooling air flow directed through the rear card cage area such that a greater portion of a total volume of air flow being output from a cooling system of the electronics enclosure is directed through a front board area partitioned by a backplane from the rear card cage area of the electronics enclosure.

2. The apparatus of claim 1, wherein the openings form a pattern of perforations or slots.

3. The apparatus of claim 1, wherein the openings are all uniformly shaped.

4. The apparatus of claim 1, wherein the openings comprise at least one of:
   circular shaped holes;
   square shaped holes;
   triangular shaped holes;
   diamond shaped holes;
   elliptical shaped holes;
   hexagonal shaped holes; and
   pentagonal shaped holes.

5. The apparatus of claim 1, wherein the panel is secured adjacent one of:
   an upper area of the card cage; and
   a lower area of the card cage.

6. A method for restricting air flow through a portion of an electronics enclosure, the method comprising:
   forming a removable panel having at least one edge adapted to be secured to a surface of the electronics enclosure to place the panel in a path of a cooling air flow flowing through a card cage portion of the enclosure, the panel being located external to the card cage portion of the enclosure;
   further forming the panel to have a footprint that completely fills an opening through which said cooling air flow flows through said card cage portion of the enclosure;
   forming the panel as a plate having a plurality of openings in the panel having all of the cooling air flow flowing through the openings, wherein the openings form a pattern of perforations grouped into spaced apart clusters, the panel openings restricting a volume of cooling air flow flowing through the panel by a predetermined degree, and thus allowing only a predetermined subportion of said volume of cooling airflow to flow through the panel into the card cage portion of the enclosure; and
   placing the panel in the enclosure in the path of the cooling air flow so as to at least partially block the cooling air flow flowing through the card cage portion of the electronics enclosure, wherein the panel restricts a subquantity of the cooling air flow directed through a rear board area of the electronics enclosure such that a greater portion of a total volume of the cooling air flow output from a cooling system of the electronics enclosure is directed through a front board area of the electronics enclosure, wherein the rear board area is separated from the front board are by a backplane.

7. The method of claim 6, wherein said forming a plurality of openings in the panel comprises forming a plurality of groups of perforations in the panel.

8. The method of claim 6, wherein said forming a plurality of openings in the panel comprises forming one or more slots in the panel.

9. The method of claim 6, wherein said forming a plurality of openings in the panel comprises forming openings having at least one of:
   circular shaped holes;
   square shaped holes;
   triangular shaped holes;
   diamond shaped holes;
   elliptical shaped holes;
   hexagonal shaped holes; and
   pentagonal shaped holes.

10. An electronics enclosure, comprising:
    a first card cage area being a front card cage area located within the electronics enclosure;
    a second card cage area being a rear card cage area located within the electronics enclosure, the first card cage area and second card cage area being separated by a backplane;
    an air flow source providing air flow to the first card cage area and to the second card cage area; and
    a panel having at least one edge adapted to be secured to a surface of the electronics enclosure to place the panel in a path of a cooling air flow flowing through a selected card cage area of the second card cage area;
    the panel having a footprint that completely fills an opening through which said cooling air flow flows through the selected one card cage area;
    the panel being formed as a plate having a plurality of openings, wherein the openings form a pattern of perforations grouped into spaced apart clusters, so that the panel reduces a volume of a cooling air flow flowing through the panel by a predetermined desired degree, and thus reduces a volume of said air flow through the selected card cage area to a desired volume, the panel footprint in substantially filling the opening thereby preventing the cooling air flow from flowing around the panel such that no portion of the cooling air flow in the selected card cage area flows around the panel thereby forcing all of the cooling air flow through the openings; and the panel being arranged so that the panel restricts the cooling air flow flowing through the selected card cage area, while the cooling air flow flowing through the other of the first card cage area or the second card cage area is increased as a result of the restriction of the cooling air flow to the one of the first area or the second area.

\* \* \* \* \*